United States Patent
Usugi et al.

(10) Patent No.: US 7,369,069 B2
(45) Date of Patent: May 6, 2008

(54) SEMICONDUCTOR DEVICE

(75) Inventors: Tatsunori Usugi, Ome (JP); Kazuhisa Suzuki, Hamura (JP); Masatoshi Tsuge, Hamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/482,071

(22) Filed: Jul. 7, 2006

(65) Prior Publication Data

US 2007/0040715 A1 Feb. 22, 2007

(30) Foreign Application Priority Data

Aug. 5, 2005 (JP) .............................. 2005-227376

(51) Int. Cl.
*H03M 9/00* (2006.01)
(52) U.S. Cl. ...................................... 341/100; 341/101
(58) Field of Classification Search ................ 341/100, 341/101
See application file for complete search history.

(56) References Cited

U.S. PATENT DOCUMENTS

| 4,882,762 | A | * | 11/1989 | Waldhauer | .................. | 381/106 |
| 7,064,690 | B2 | * | 6/2006 | Fowler et al. | .............. | 341/101 |
| 7,116,251 | B1 | * | 10/2006 | Groen et al. | ................. | 341/100 |
| 7,200,832 | B2 | * | 4/2007 | Butt et al. | .................... | 716/17 |

FOREIGN PATENT DOCUMENTS

JP          07-046143 A          2/1995

* cited by examiner

*Primary Examiner*—Rexford Barnie
*Assistant Examiner*—Joseph Lauture
(74) *Attorney, Agent, or Firm*—Miles & Stockbridge P.C.

(57) ABSTRACT

A semiconductor device including a clock signal generation circuit and a plurality of circuit blocks operating in synchronization with the clock signal, in which each of the plurality of the circuit blocks conducts resetting treatment receiving the interruption signal reset_in outputted in synchronization with the clock signal in the course of frequency acquisition, whereby the timing margin is improved greatly to facilitate the design of timing for a case of conducting interruption between a plurality of circuit blocks operating at high speed simultaneously and decrease circuit scale and power consumption.

3 Claims, 13 Drawing Sheets

SEMICONDUCTOR DEVICE

CLAIM FOR PRIORITY

The present application claims priority from Japanese application JP 2005-227376 filed on Aug. 5, 2005, the content of which is hereby incorporated by reference into this application.

FIELD OF THE INVENTION

The present invention concerns a semiconductor device and, more particularly, it relates to a simultaneous interruption system between a plurality of circuit blocks and mounting thereof.

BACKGROUND OF THE INVENTION

JP-A No. 46143/1995 shows an example of a reset system in a case of a parallel to serial conversion circuit and a series to parallel conversion circuit. Particularly, FIG. 1 discloses a system of sending a reset signal to a first parallel to serial conversion circuit and sending the reset signal synchronized in the first parallel to serial conversion circuit sequentially to second and third parallel to serial conversion circuits thereby conducting resetting while sequentially synchronizing all of the parallel to serial conversion circuit.

SUMMARY OF THE INVENTION

Figure 1:
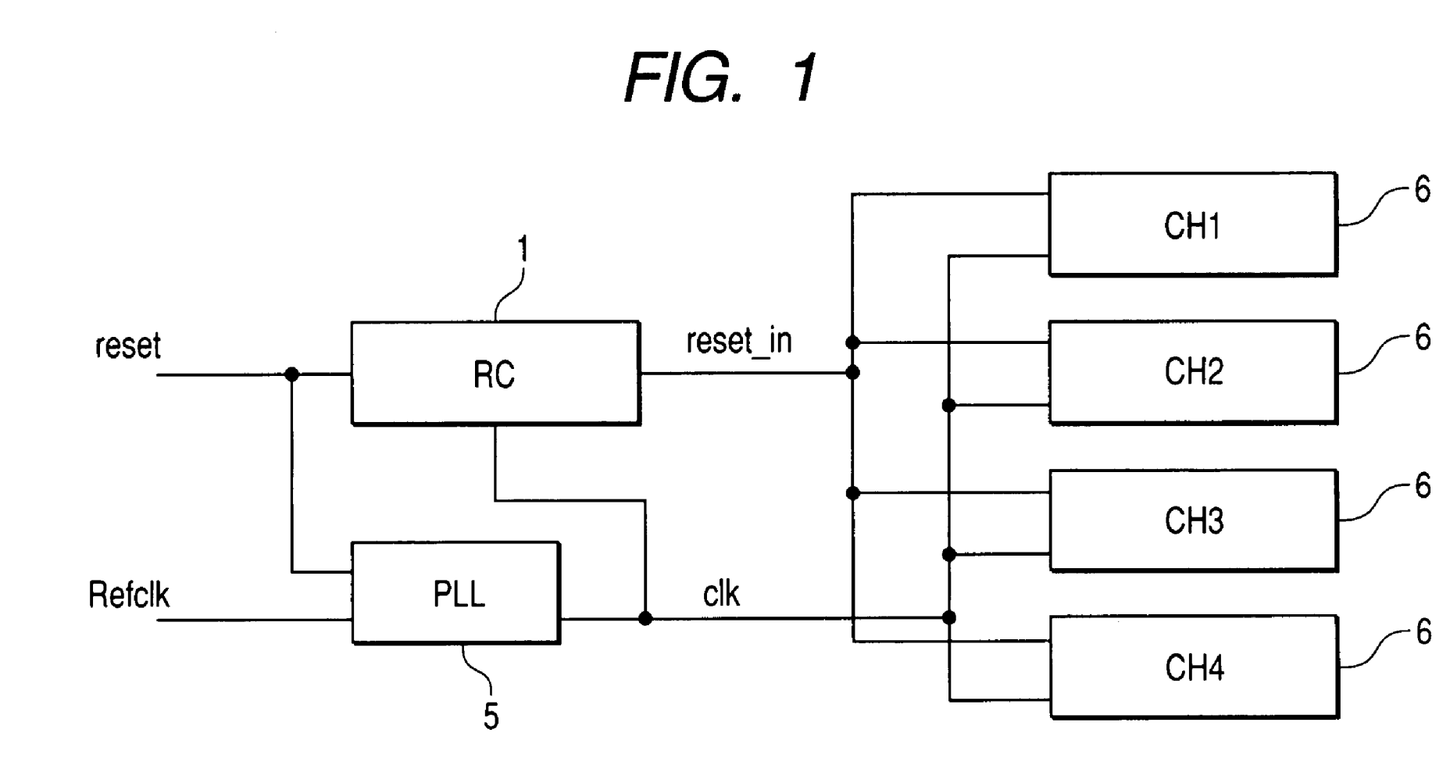
FIG. 1 is a block diagram showing the constitution of a SerDes circuit.

FIG. 1 is a block diagram for a serial interface circuit. FIG. 1 shows an example having a 4-channel SerDes circuit (Serializer-Deserializer) 6. As will be described later, the SerDes circuit has a parallel to serial conversion circuit for converting parallel data into serial data and a serial to parallel conversion circuit of converting serial data into parallel data. The 4-channel SerDes circuit 6 is adapted to be inputted with a clock signal clk from a PLL (Phase Locked Loop) circuit 5 and reset signal reset_in from a reset control circuit 1. After acquisition in the PLL circuit 5, the reset signal reset_in from the reset control circuit 1 is distributed at an equal delay time to each of the SerDes circuits 6, and each SerDes circuit 6 conducts resetting.

Figure 2:
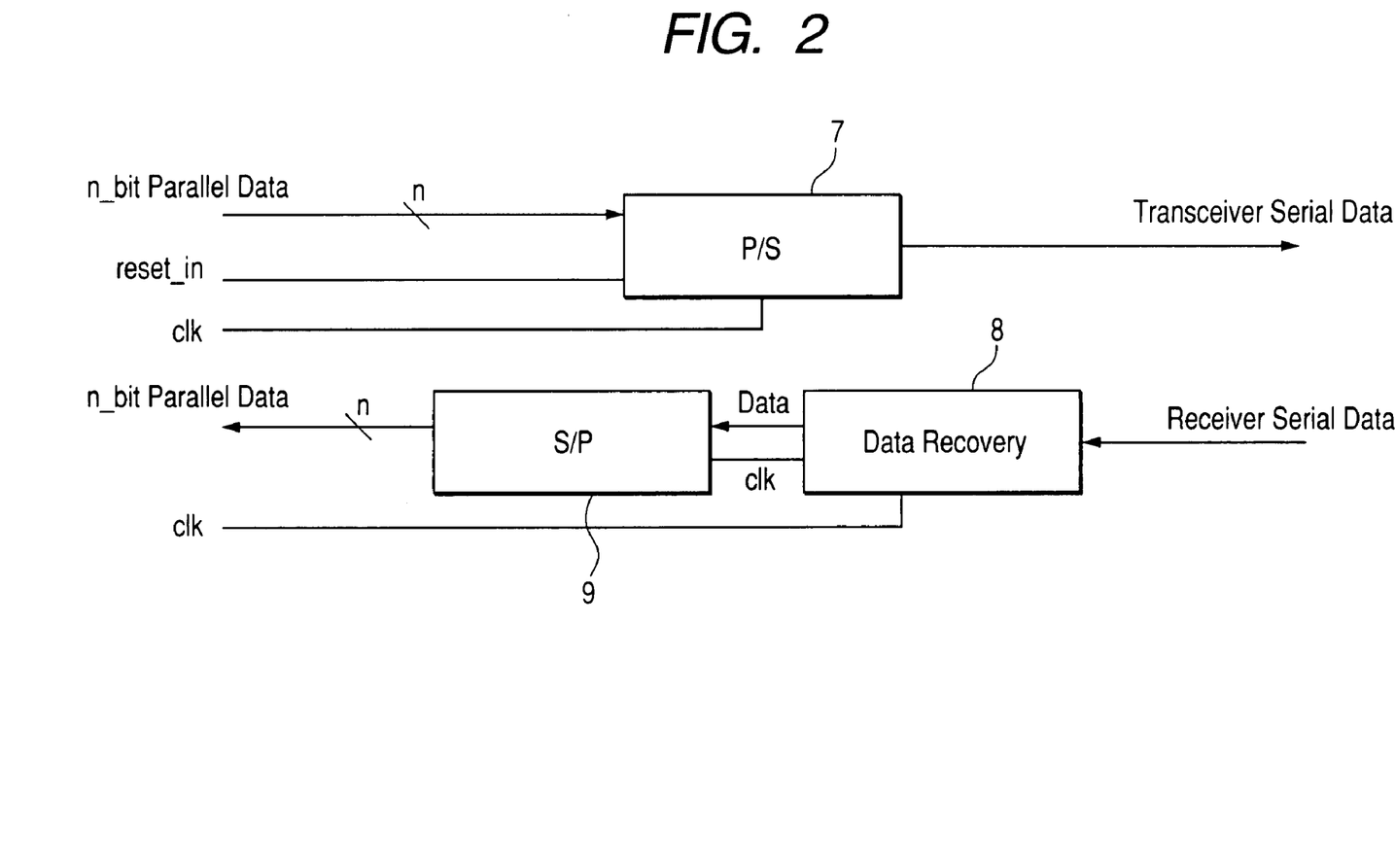
FIG. 2 is a block diagram showing the constitution of a parallel to serial conversion circuit and a serial to parallel conversion circuit of the SerDes circuit.
Figure 3:
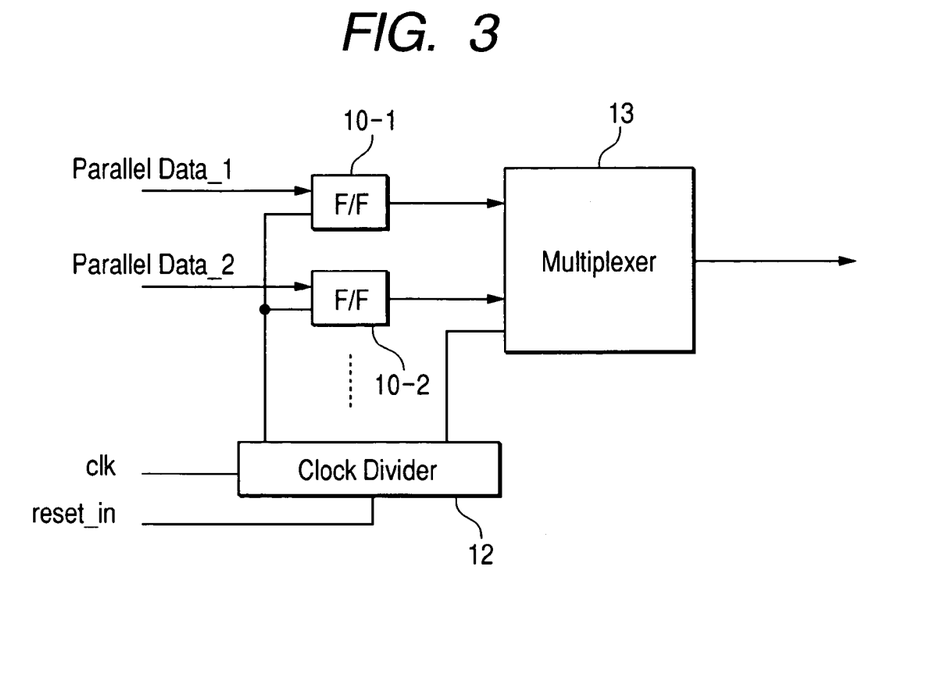
FIG. 3 is a block diagram showing the constitution of the parallel to serial conversion circuit.

The constitution of the SerDes circuit 6 is to be described with reference to FIG. 2. The SerDes circuit 6 comprises an n:1 parallel to serial conversion circuit 7, 1:n serial to parallel conversion circuit 9 and a data recovery circuit 8. Further, FIG. 3 shows the constitution of the parallel to serial conversion circuit 7. In the parallel to serial conversion circuit 7, parallel data are respectively taken into flip-flop circuits 10, and the parallel data taken into flip-flop circuits 10 are converted into serial data by a multiplexer 13. The parallel to serial conversion by the flip-flop circuits 10 and the multi-plexer 13 is conducted by divisional clocks of the clock signal clk outputted from a clock divider 12. The timing for the parallel to serial conversion operation of the parallel to serial conversion circuit 7 is decided by a holding voltage of a flip-flop circuit (not illustrated) contained in the clock divider 12. For example, the flip-flop circuit of the clock divider 12 is at "H" level which is turned to "L" level upon receiving the reset signal reset_in to release resetting and the parallel to serial conversion operation is started at the timing of the next clock signal clk.

Figure 4:
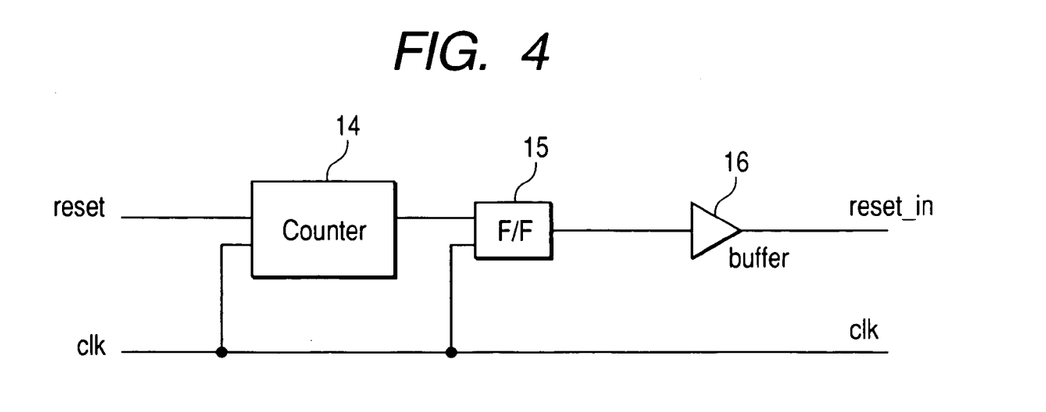
FIG. 4 is a block diagram showing the constitution of a reset control circuit 1.

FIG. 4 shows the constitution of the reset control circuit 1. It comprises a counter circuit 14, a flip-flop circuit 15 and a buffer circuit 16. Upon reception of an external reset signal "reset", the PLL circuit 5 starts frequency acquisition (refer to FIG. 1), and the counter circuit 14 counts the clock signal clk by a predetermined number so as to provide a sufficient time interval as a frequency acquisition time and then outputs the reset signal reset_in of the SerDes circuit 6. The output from the counter circuit 14 is synchronized with the clock signal clk by the flip-flop circuit 15. The buffer circuit 16 has a role of adjusting the delay time such that the reset signal reset_in is inputted to each SerDes circuit at the timing of the reset margin as will be described later.

Figure 5:
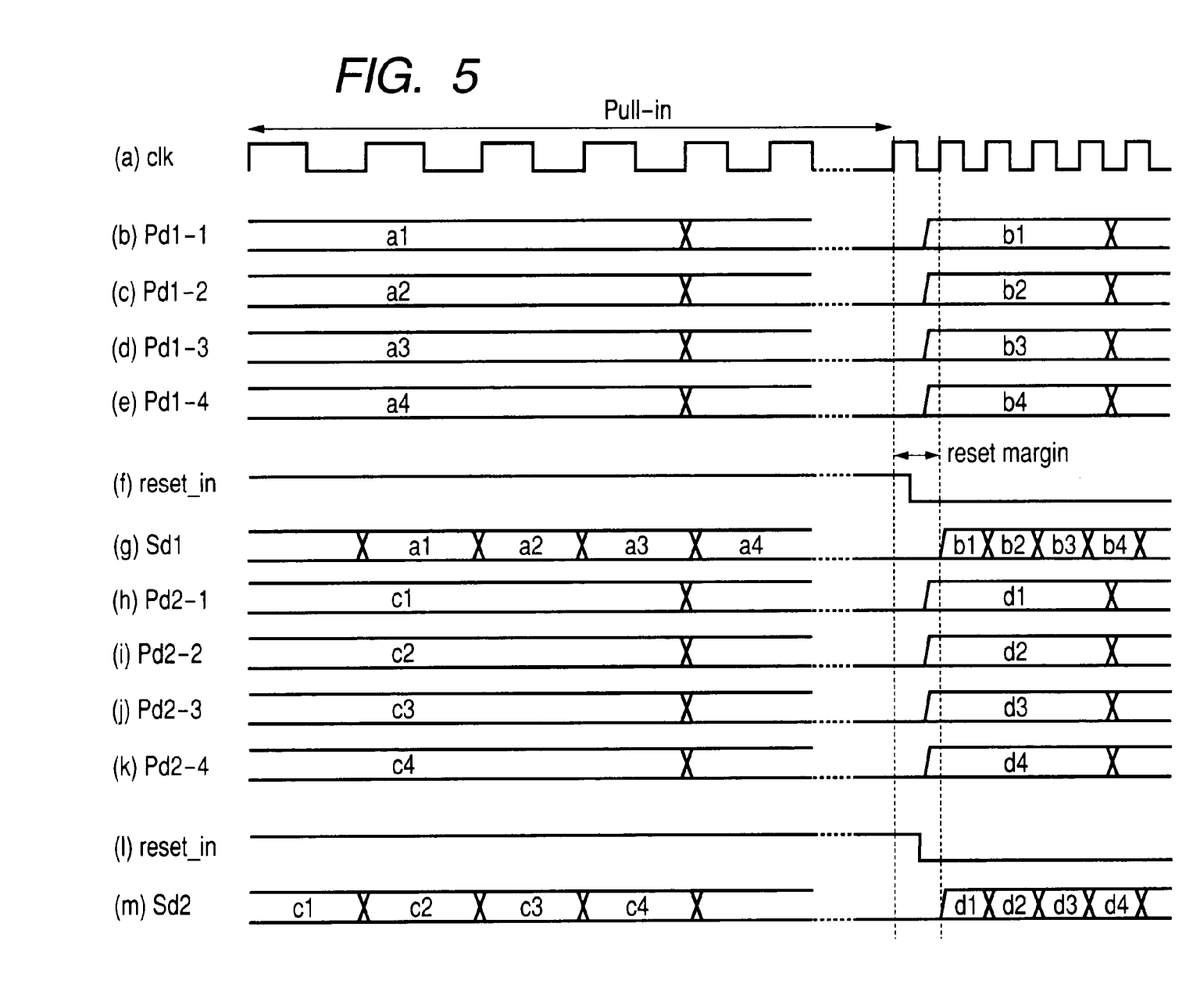
FIG. 5 is a reset operation timing chart in an existent parallel to serial conversion circuit.

FIG. 5 is a timing chart showing the reset operation of the parallel to serial conversion circuit in a case: n=4 (4:1 parallel to serial conversion circuit). FIG. 5(a) shows a clock signal clk inputted from the PLL circuit 5 to the SerDes circuit 6 (channels 1, 2), and FIGS. 5(b) to 5(e) show 4 bit parallel data inputted to the parallel to serial conversion circuit of the SerDes circuit 6 (channel 1), FIG. 5(f) shows a reset signal reset_in inputted from the reset control circuit 1 to the SerDes circuit 6 (channel 1), FIG. 5(g) shows serial data outputted from the parallel to serial conversion circuit of the SerDes circuit 6 (channel 1). In the same manner, FIG. 5(h) to 5(k) show 4 bit parallel data inputted to the parallel to serial conversion circuit of the SerDes circuit 6 (channel 2), FIG. 5(l) shows a reset signal reset_in inputted from the reset control circuit 1 to the SerDes circuit 6 (channel 2), and FIG. 5(m) shows serial data outputted from the parallel to serial conversion circuit of the SerDes circuit 6 (channel 2).

In the clock acquisition period ("Pull-in") period of the PLL circuit 5, the flip-flop circuit constituting the clock divider 12 is instable at the holding voltage just after the operation and the timing for parallel to serial conversion between each of the channels is not matched. Accordingly, the timing of the serial data outputted from the parallel to serial conversion circuit of the channel 1 and the parallel to serial conversion circuit of the channel 2 are at first displaced between the channels as shown in FIG. 5(g), (m). Accordingly, after completion of the clock acquisition and stabilization of the clock signal clk in the PLL circuit 5, all the channels are reset simultaneously to take synchronization for all the channels. Thus, parallel to serial conversion can be conducted in synchronization for each of the channels.

However, it has been found by the present inventors that the following problem may possibly occur as the communication frequency in serial communication becomes higher. For the reset signal reset_in and the clock signal clk, a technique of equal length wiring or the like is used so that the reset signal reset_in and the clock signal clk are inputted each at an identical timing to each SerDes circuit 6 and the timing of signal input is synchronized. However, as shown in FIG. 5(f), (l), the input timing required for the reset signal reset_in is within a range for one period of the clock signal clk (FIG. 5(a)). Accordingly, as the operation speed increases (that is, the operation frequency is higher), the margin for the timing design is decreased extremely. By the displacement for the input of the reset signal reset_in and/or the clock signal clk due to the scattering in the production process or fluctuation of the power source, etc. the timing for the input of the reset signal reset_in to each of SerDes circuits may possibly be displaced.

As one of the countermeasures, JP-A No. 46143/1995 discloses a system of sending a reset signal synchronized to the first parallel to serial conversion circuit, sending a reset signal synchronized with the first parallel-to-serial conversion circuit after resetting, and conducting resetting while synchronization successively with second, third, and $n_{th}$ circuits. That is, in this counter measure, a circuit is added for synchronized resetting to each of the channels of the SerDes circuit. Accordingly, the circuit scale and the consumption power are increased as the number of the channels of the SerDes circuits increases.

Since the demand for the increase of the number of channels has been increased more at present and multi-channel arrangement is indispensable for the SerDes circuit, means capable of suppressing increase in the circuit scale or consumption power for the synchronization as much as possible has been desired.

A typical example of the present invention is as described below. That is, it comprises a clock signal generation circuit that receives the input of a reference clock signal and outputs clock signal, a plurality of circuit blocks that operate in synchronization with the clock signal, and a control circuit for distributing control signals to a plurality of the circuit blocks, in which the clock signal generation circuit inputs the clock signal in the course of frequency acquisition to the control circuit and the plurality of the circuit blocks, and each of the plurality of the circuit blocks conducts interruption upon receiving the interruption signals that the control signal outputs in synchronization with the clock signal in the frequency acquisition process of the control circuit.

The designed margin for the timing is improved in the simultaneous interruption treatment of a plurality for the circuit blocks.

DETAILED DESCRIPTION OF THE PREFERRED EMBODIMENTS

The present invention is to be described by way of preferred embodiments.

Figure 6:
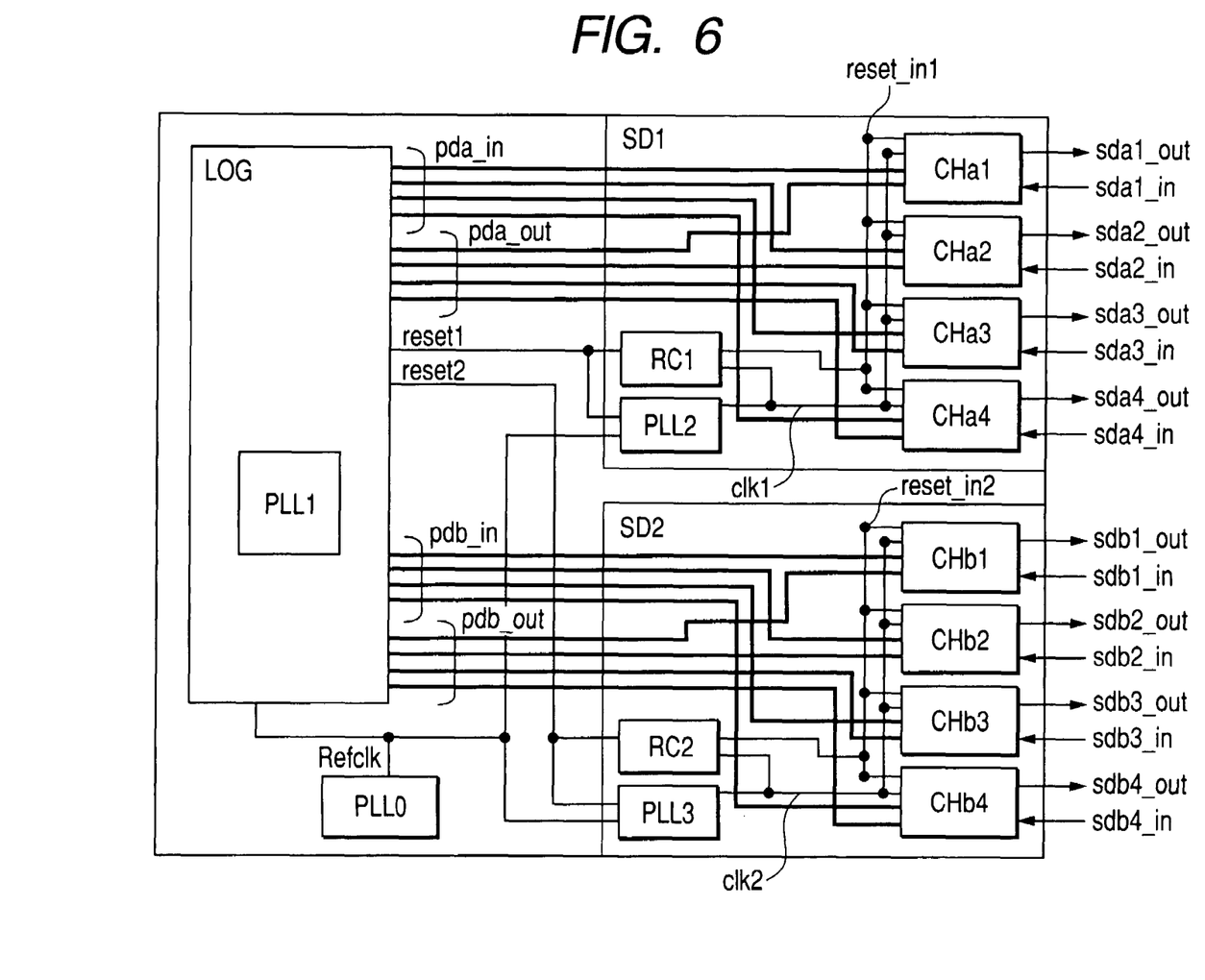
FIG. 6 is a block diagram of a semiconductor integrated circuit device according to Embodiment 1.

FIG. 6 is a block diagram of a semiconductor integrated circuit device mounting SerDes circuits to which the invention is applied. Parallel data pda_in are inputted from an internal circuit LOG to a first SerDes circuit SD1 which are outputted from each of the channels CHa1-a4 as serial data sda1_out to sda4_out to an external apparatus. Conversely, the serial data sda1_in to sda4_in inputted from the external apparatus to each of the channels CHa1_a4 from the external device are inputted as parallel data pda_out to the internal circuit LOG. In this example, a second SerDes circuit SD2 is also shown and it conducts identical circuit operation. In the drawing, transmission lines for parallel data (such as pda_in, pda_out, etc.) are shown by a single line in order to avoid complexity of the drawing. Further, in FIG. 6, the internal circuit LOG is shown merely as a representative of the logic circuit for the semiconductor integrated circuit device and it does not intends to exclude such a form of outputting signals from different internal circuits to a plurality of SerDes circuits.

The internal circuit LOG is a logic circuit that operates by clocks generated from the PLL circuit PL1. The signal transmission with the SerDes circuit in the semiconductor integrated circuit device is conducted as parallel data. For example, the operation frequency of the PLL circuit (PLL2, 3) that determines the operation speed of the SerDes circuit is considered as about 1 to 5 GHz, whereas the operation frequency of the PLL circuit PLL1 that determines the circuit operation and the transmission rate of parallel data of the internal circuit LOG is lower by about one digit as several hundreds MHz. A reference clock signal Refclk generated from a reference signal generation circuit PLL0 is inputted to the PLL circuit PLL1 of the internal circuit LOG and the PLL circuit (PLL2, 3) of the SerDes circuit and they operate in synchronization therewith.

Since the constitution and the operation of the SerDes circuit have already been described in FIG. 1 or the like also including the operations of the reset control circuit RC, PLL circuit PLL, etc. they are not repeated. Further, the number of channels included in one SerDes circuit is not restricted to 4 and it may be constituted with channels by the number, for example, of about 10.

Figure 7:
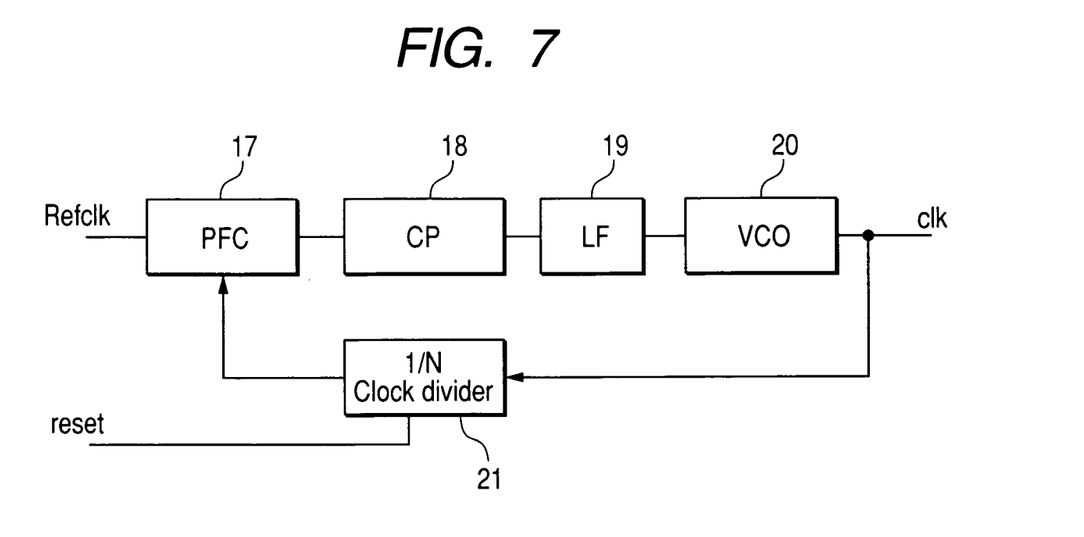
FIG. 7 is a block diagram of a PLL circuit.

The PLL circuit comprises, for example, as shown in FIG. 7, a phase comparator 17, a charge pump 18, a loop filter 19, a voltage controlled oscillator 20, and a clock divider 21. In the operation, the phase of a reference clock signal given from the outside of the PLL circuit and the phase of an output clock signal are synchronized. The PLL circuit has a feature of having an acquisition time till oscillation at a predetermined frequency. Among the PLL circuits in FIG. 6, a DLL circuit may also be utilized for PLL1 or PLL0 providing that multiplication of the output clock signal is not necessary. Further, while the drawing shows an example of a constitution incorporating the PLL circuit PLL0 that generates the reference clocks Refclk, a clock signal inputted from the outside can also be used directly as the reference clock signal. In this case, the external reference clock signal inputted from the outside is used, for example, as the reference clock signal Refclk for the PLL circuits (PLL1, PLL2, PLL3).

Figure 8:
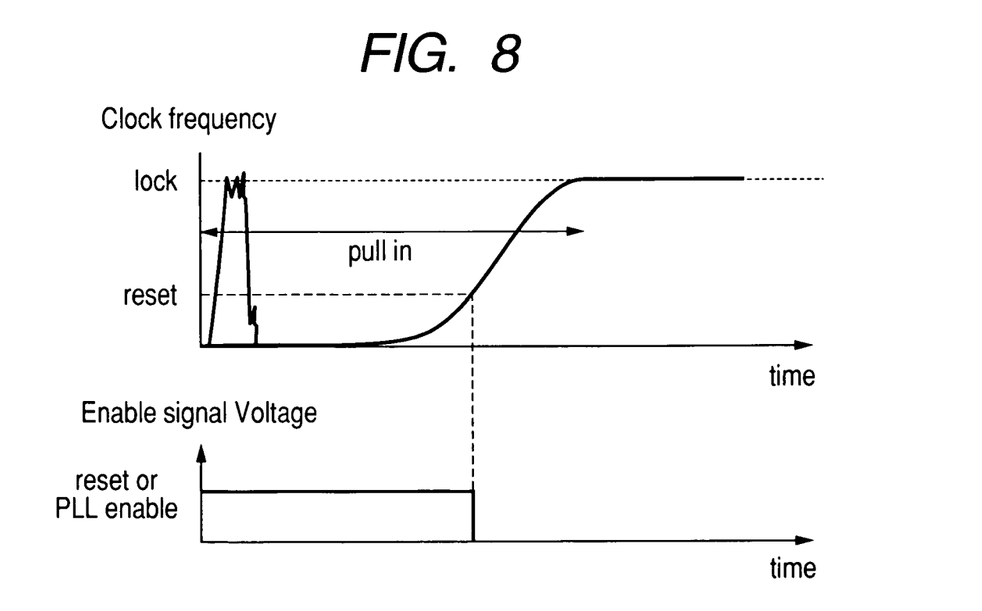
FIG. 8 is a view showing the frequency acquisition process and the timing for resetting (PLL enabling) in PLL frequency acquisition process.

In this embodiment, for synchronization of the reset signal reset_in1 of each of the channels CHa1-a4 of the SerDes circuit SD1, a clock of lower frequency before completion of acquisition of the PLL circuit PLL2 is used for synchronization of the reset signal. FIG. 8 shows the operation characteristic upon acquisition of the PLL circuit, expressing the time on the abscissa, the oscillation frequency on the ordinate and the acquisition start point as the original point. Just after the start of acquisition, the state of frequency is instable, then the oscillation frequency increases gradually and becomes stable at a predetermined synchronized frequency. Generally, a time required for the PLL circuit to output clocks at a constant frequency is defined as an acquisition time ("Pull-in" in the drawing), during which the PLL circuit outputs clocks at a lower frequency compared with the frequency after acquisition.

Figure 9:
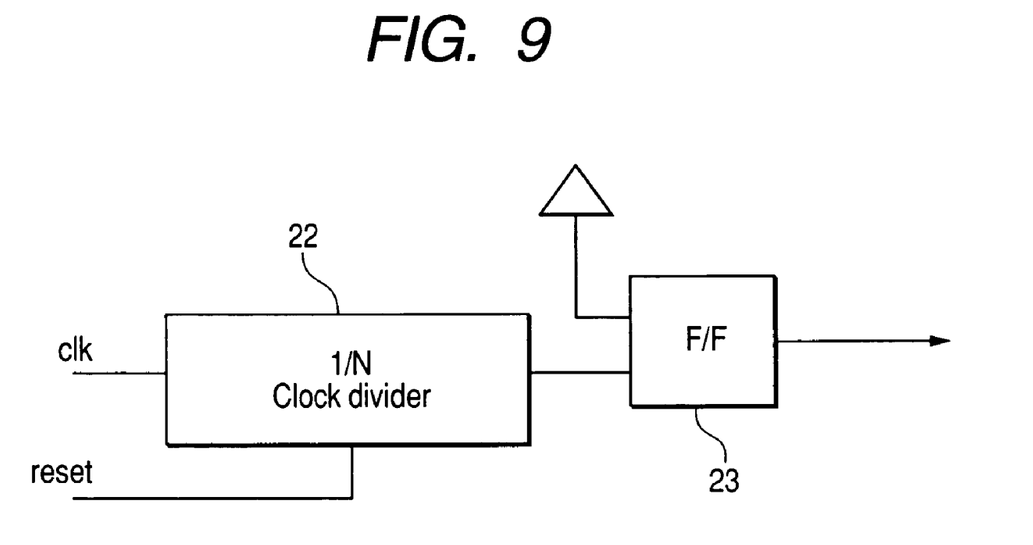
FIG. 9 is a block diagram showing the constitution of a counter circuit.

Then, a reset control circuit (refer to FIG. 4) for generating an internal reset signal reset_in is constituted as described below. FIG. 9 is an example for the constitution of a counter 14 of the reset control circuit 1. The counter circuit 14 comprises a 1/N clock divider 22 and a flip-flop circuit 23 and generates an output just after the start of operation of the PLL circuit 5. It outputs a reset signal after counting instable initial component for an N period. The outputted reset signal is synchronized by the flip-flop circuit 15 (refer to FIG. 4) with the clock clk and distributed to each of the channels of the SerDes circuit (refer to FIG. 1).

Figure 10:
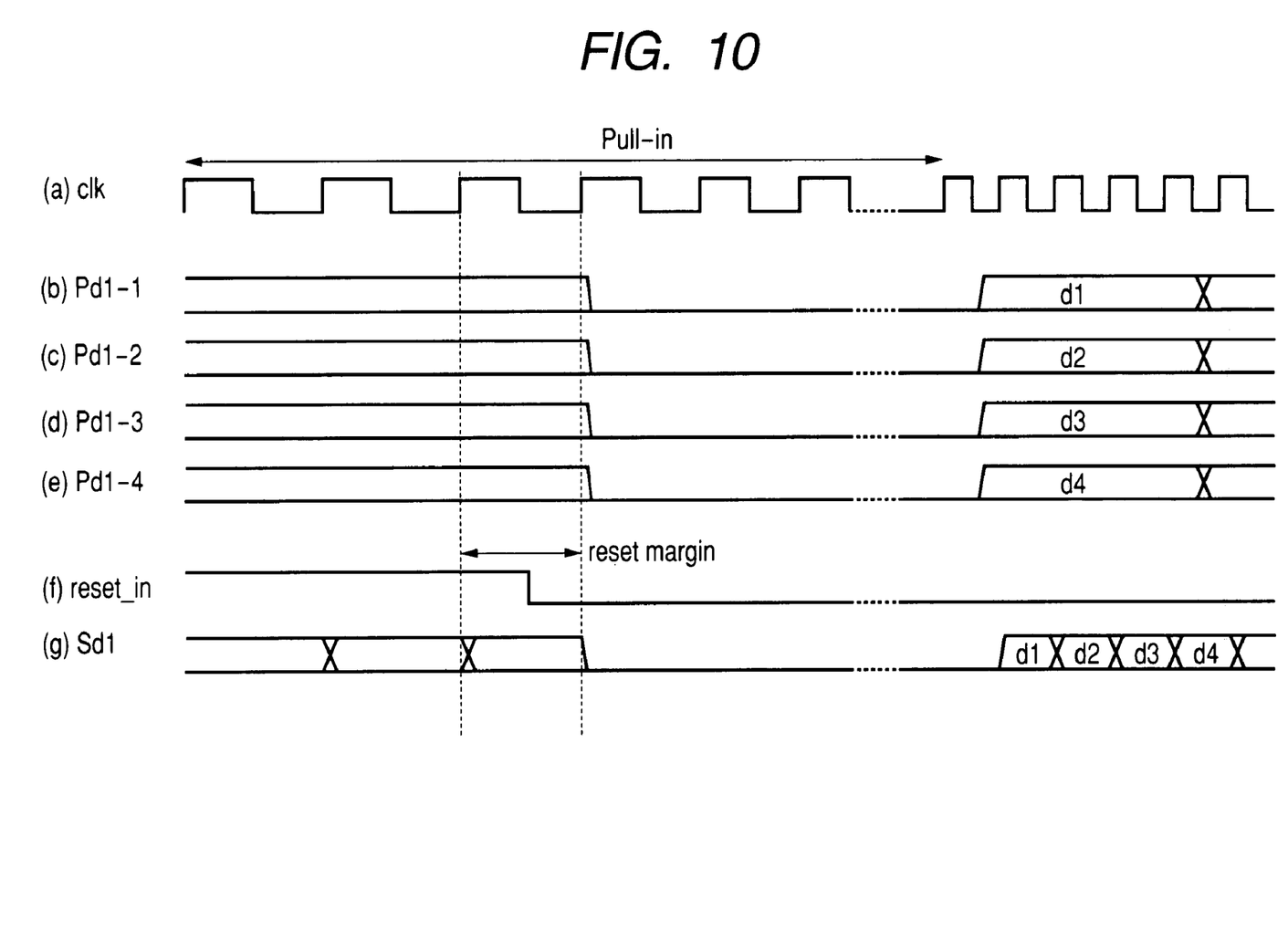
FIG. 10 is a timing chart for the resetting operation in a case of applying the invention to a parallel to serial conversion circuit.

FIG. 10 is a timing chart showing the reset operation of the parallel to serial conversion circuit at n=4 (4:1 parallel serial conversion circuit) in the channel 1 of the SerDes circuit shown in FIG. 1. FIG. 10(a) shows a clock signals clk inputted from the PLL circuit 5 to the SerDes circuit 6 (channel 1), FIG. 10(b) to (e) show 4 bit parallel data inputted to the parallel to serial conversion circuit of the SerDes circuit 6 (channel 1), FIG. 10(f) shows a reset signal reset_in inputted from the reset control circuit 1 to the SerDes circuit 6 (channel 1), and FIG. 10(g) shows serial data outputted from the parallel to serial conversion circuit of the SerDes circuit 6 (channel 1). As apparent by comparison with the example of FIG. 5, the timing margin upon input of the reset signal reset_in to each of the channels can be increased by making it as one period of the clock signal at a lower frequency before completion of acquisition of the PLL circuit. This enables to conduct synchronization resetting (releasing) operation for plural channels also by a SerDes circuit of high operation frequency.

In this embodiment, the data put to parallel to serial conversion before completion of acquisition of the PLL circuit 5 are invalid data. Accordingly, it is necessary to validate the data put to parallel to serial conversion after the completion of acquisition and this can be attained, for example, by a method of inserting a character indicative of the top of the data. As described above, in this embodiment, the timing margin of the reset signal can be increased irrespective of the frequency after acquisition and, accordingly, a great effect can be obtained with no restriction for the effective operation frequency region, particularly, as the operation speed is higher.

Figure 11:
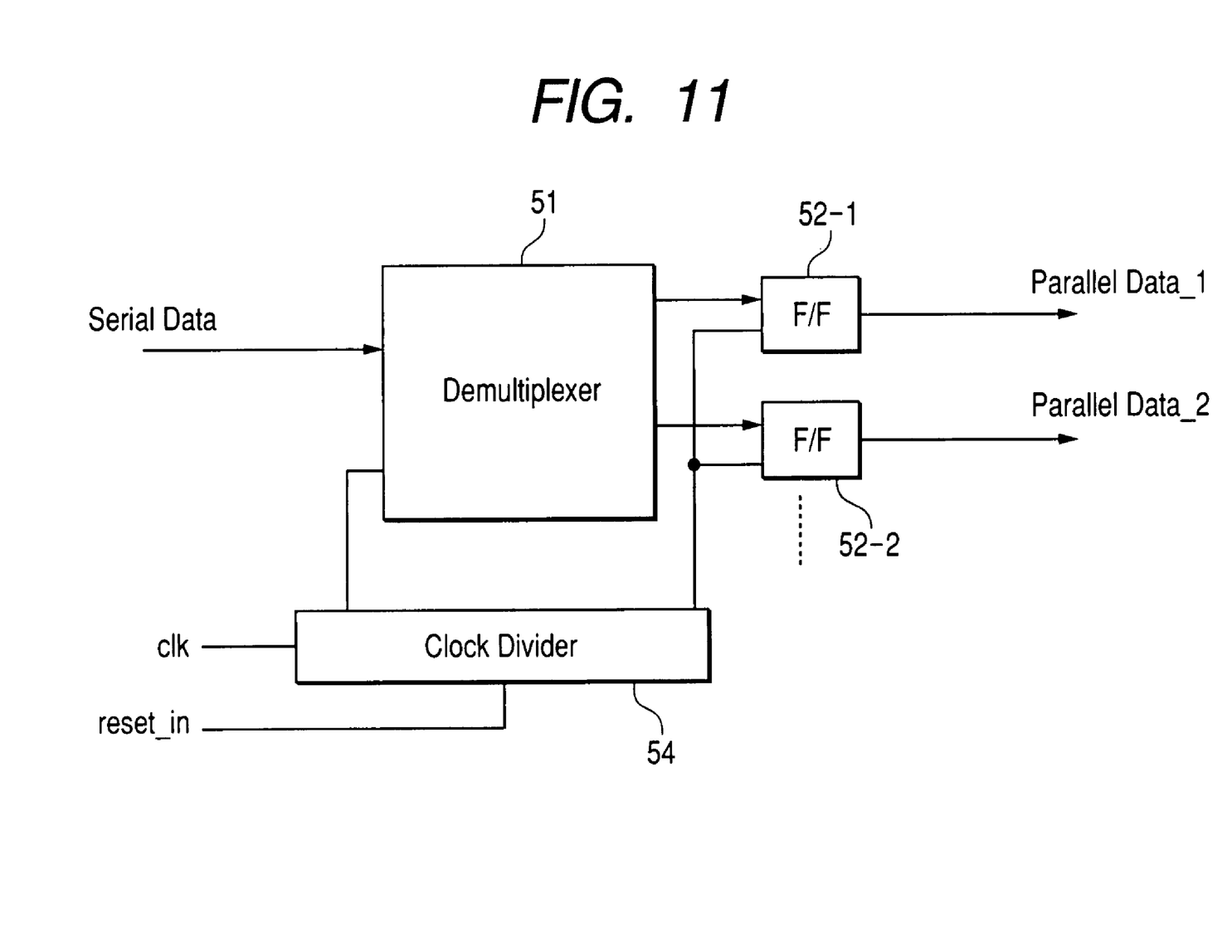
FIG. 11 is a block diagram showing the constitution of a serial to parallel conversion circuit.
Figure 12:
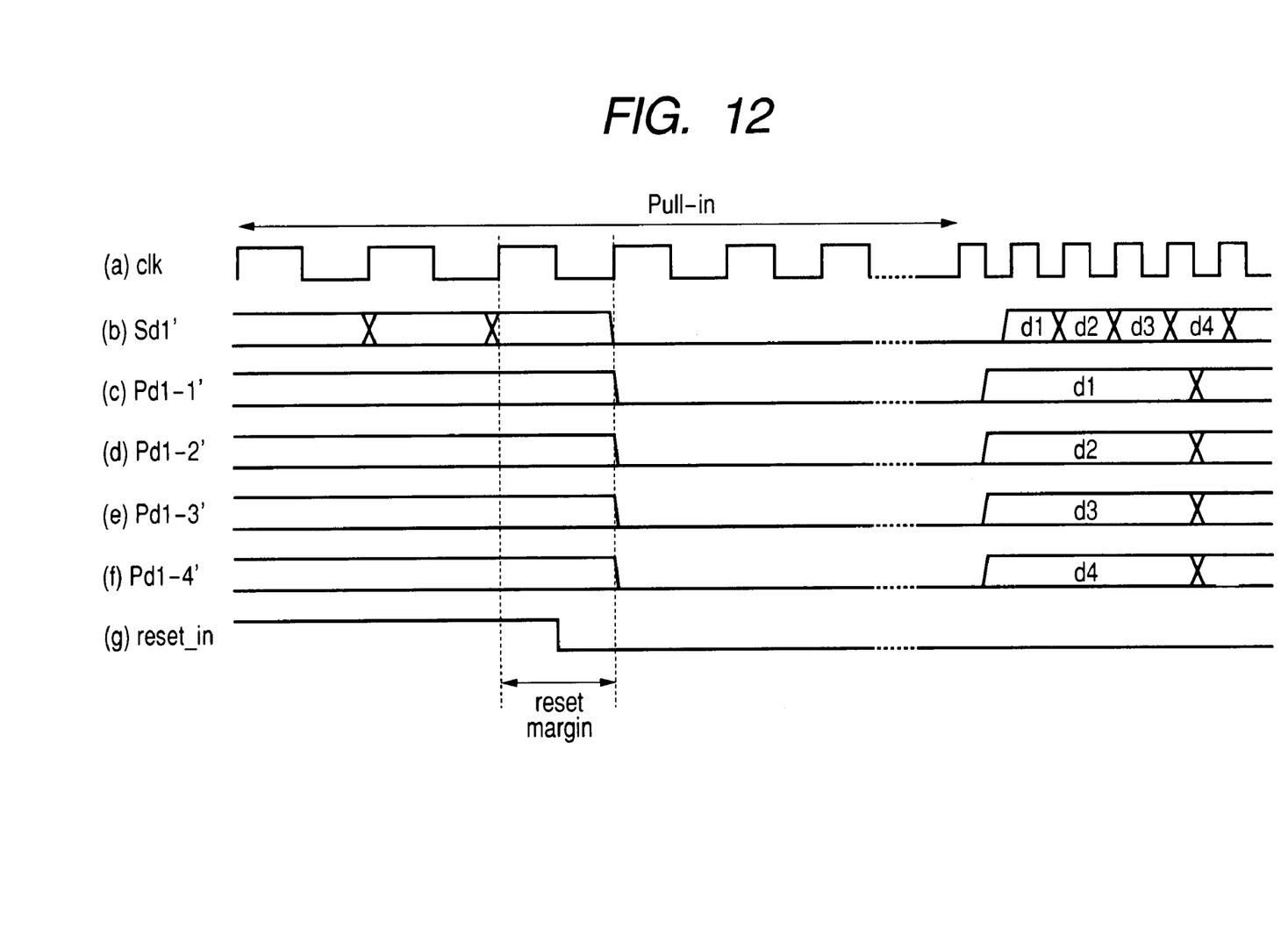
FIG. 12 is a timing chart for the resetting operation in a case of applying the invention to a serial to parallel conversion circuit.

While the example of the parallel to serial conversion circuit has been shown, also the serial to parallel conversion circuit can be constituted in the same manner. FIG. 11 is an example of a constitution for a serial to parallel conversion circuit included in the SerDes circuit 6 (refer to FIG. 1). As shown in the drawing, it comprises a multiplexer 51, a flip-flop circuits 52 connected with parallel data output terminals of the multiplexer 51, and a clock divider 54 connected with the flip-flop circuits 52. The clock divider 54 is a circuit that generates a clock for taking the parallel data outputted from the demultiplexer 51 into the flip-flop circuits. Also in the serial to parallel conversion circuit, the timing margin for resetting can be improved by conducting resetting in the course of the frequency acquisition of the PLL circuit 5 and validating the serial to parallel conversion after the completion of the clock acquisition in the same manner as in the parallel to serial conversion circuit.

Embodiment 2

Figure 13:
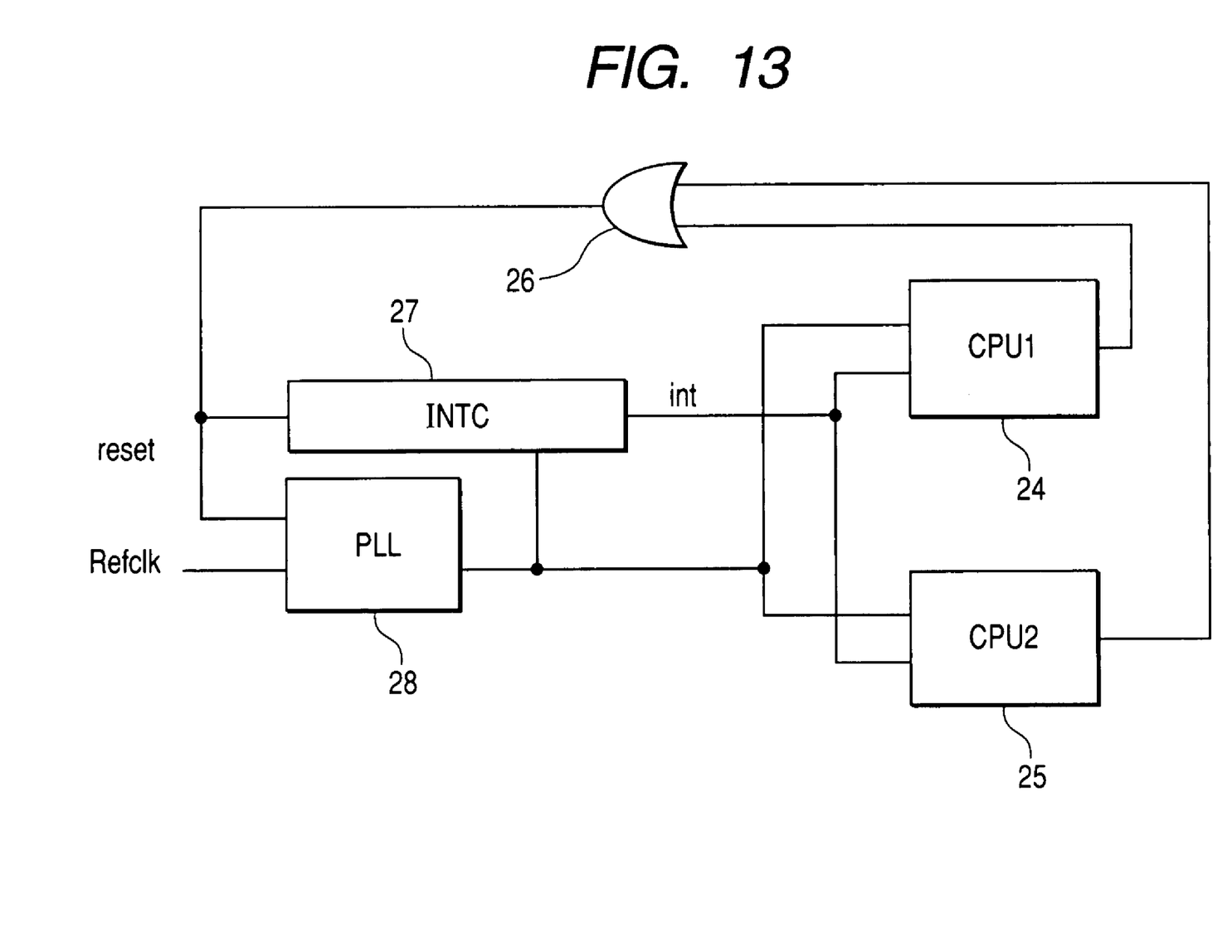
FIG. 13 is a block diagram of a multi-CPU system according to Embodiment 2.

The invention is not restricted only to the SerDes circuit but applicable generally to a case of intending to input signals under synchronization to a plurality of circuit blocks. FIG. 13 shows an example. In this case, an embodiment is shown in a case where CPU is used, for example, as the circuit block and the invention is utilized for conducting simultaneous interruption in a multi-CPU system having a plurality of CPUs. In a case where at least one of the plural CPU modules operates abnormally, the multi-CPU system sometimes gives interruption signals simultaneously to all of the CPU modules upon receiving an abnormal operation detection signal from the CPU module in question.

Both of a CPU module 24 and a CPU module 25 operate based on the clock signal from the PLL circuit 28. The abnormal operation signal "reset" from the CPU module 24 and the CPU module 25 are inputted respectively through an OR circuit 26 to an interruption control circuit 27 and a PLL circuit 28. In a case of receiving the abnormal operation signal "reset", the interruption control circuit 27 distributes the interruption signal "int" to each of the CPU modules during the acquisition time of the PLL circuit 28 thereby capable of satisfying the operation demand and greatly improving the timing margin.

While the CPU is shown as an example in this embodiment, it may be any circuit block having an interruption function with no particular restriction for the function, the number, and the type. Further, it may be of such a constitution as controlling the reset signal to the reset control circuit and the operation signal of the PLL circuit independently so long as the acquisition operation of the PLL circuit can be timed with the reset timing.

The present invention has been described above based on the two embodiments. The invention is not restricted to the embodiments described above but can be changed variously within the scope not departing the gist thereof. Further, the invention concerns distribution of the interruption control signal typically represented by the interruption signal or reset signal into a plurality of circuit blocks each at an equal delay time, and decrease in the designed margin for the timing caused by the production process or the fluctuation of power supply can be suppressed by adopting a predetermined form with regard to the layout for the arrangement of the PLL circuit and each of the modules upon mounting.

Figure 14A:
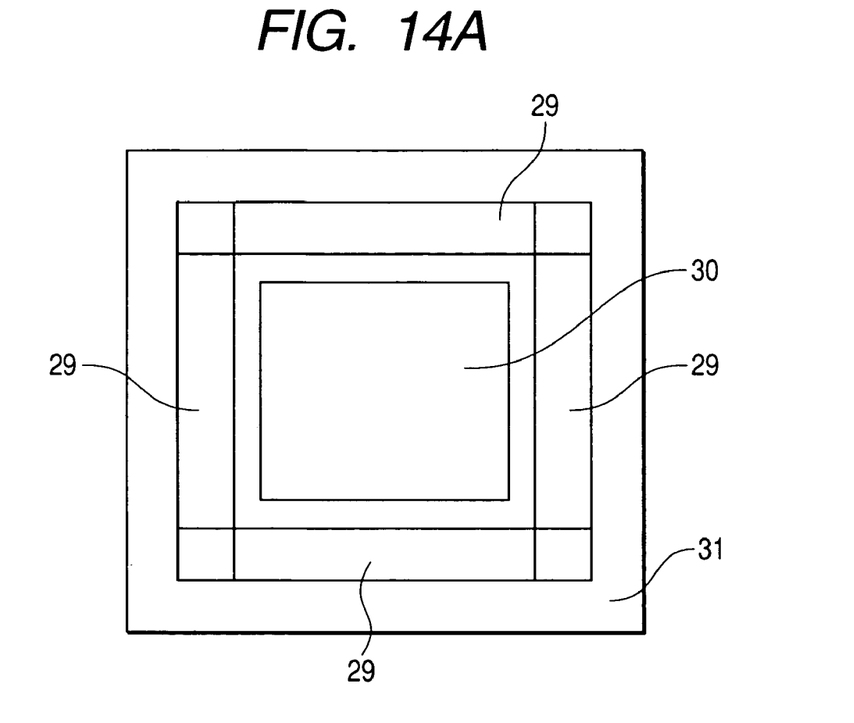
FIG. 14A is a layout for a semiconductor device.
Figure 14B:
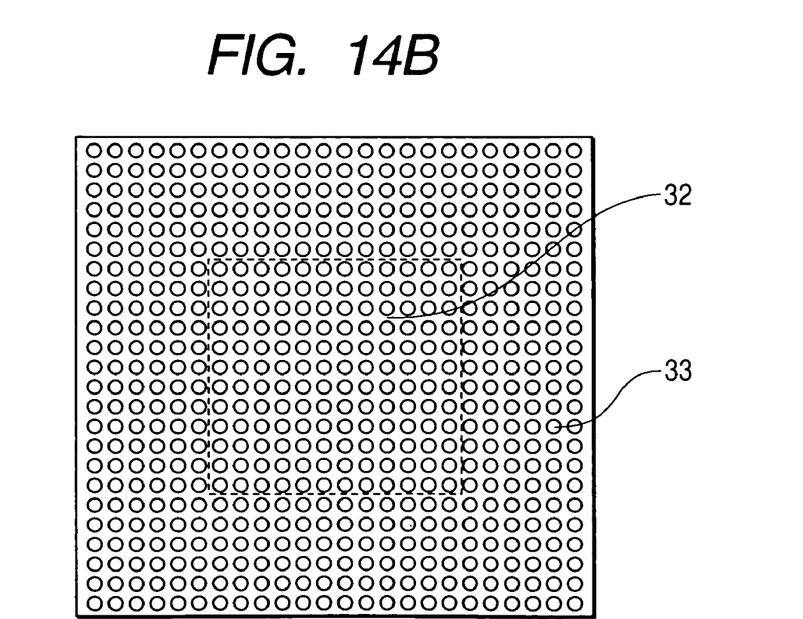
FIG. 14B is a view for the arrangement of pins.
Figure 15:
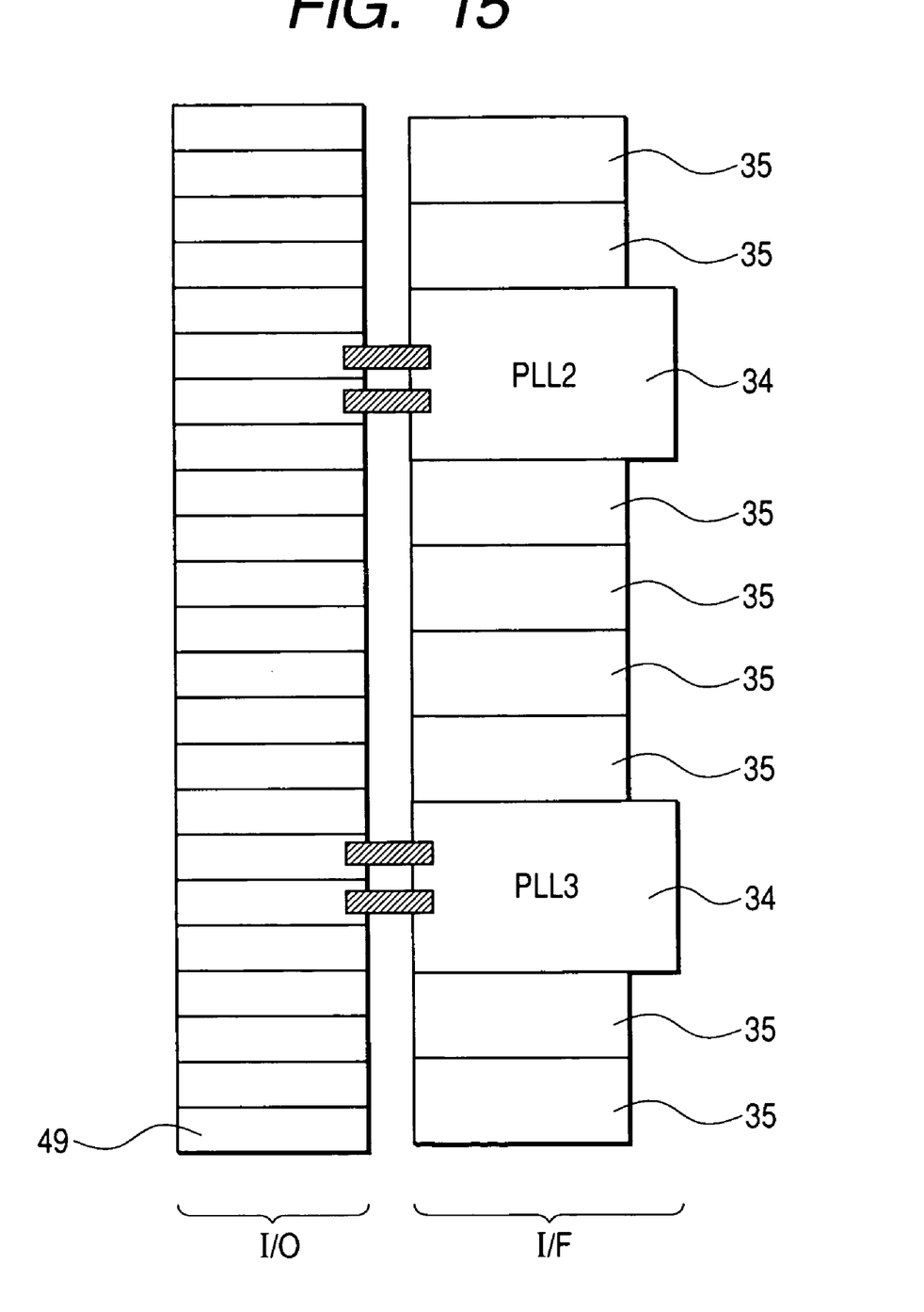
FIG. 15 is a layout for an I/F circuit and an I/O circuit.

FIG. 14A is a schematic view for the layout of a semiconductor integrated device shown in FIG. 6 and FIG. 14B is a corresponding bump view on a semiconductor device. In the layout view for the semiconductor integrated circuit device (FIG. 14A), a region 29 is an I/F circuit region in which SerDes circuit SD is disposed, a region 30 is an internal logic circuit region in which an internal circuit LOG is disposed, and a region 31 is an I/O circuit region. The I/O circuit region includes an input/output buffer circuit, a static charge protective device and, optionally, a level conversion circuit. Further, in the bump view (FIG. 14B), the portion shown by a frame as a region 32 is a region where power supply pins for internal logic circuit are arranged and a region 33 outside the frame of the region 32 is a region where power supply for I/F circuit and I/O circuit and signal pins are arranged. Then, FIG. 15 shows an arrangement of SerDes circuits in the I/F circuit region 29 and the I/O circuit region 31. The PLL circuit is disposed to the region 34 in the I/F circuit region, and each of the channels of the SerDes circuit are disposed in the regions 35 on both sides thereof. The power for the PLL circuit is supplied from the outside on every PLL circuits by way of the I/O region for signal input/output. This can make the signal pin layout and the package in common even when the arrangement of the PLL circuit is changed to provide an effect of facilitating the design. In the I/O region for supplying the power for the PLL circuit, only the interconnection may be disposed, or the static charge protective device can be disposed. Further, inter-power supply interference can be decreased by separating the power supply for the internal logic circuit and the power supply for the I/F·I/O circuit and supplying the power through an RC filter disposed to the outside of the semiconductor device, thereby capable of distributing low jitter clock signal to each of the channels of the SerDes circuit 35. Further, since the clock signal lines and the reset signal lines can be wired in equal length geometrically by disposing PLL on every several channels of the SerDes circuits, more stable simultaneous resetting for a plurality of modules can be attained in the design for the timing.

What is claimed is:

1. A semiconductor device comprising:
a clock signal generation circuit which receives a reference clock signal and which outputs a clock signal, the clock signal generation circuit including a phase-locked loop (PLL) circuit;
a plurality of parallel-serial conversion circuits; and
a counter circuit,
wherein the counter circuit outputs a reset signal in synchronization with the clock signal and counts the clock signal to a predetermined number,
the reset signal is distributed to each said parallel-serial conversion circuit when a count of the counter circuit equals the predetermined number,
the plurality of parallel-serial conversion circuits are reset simultaneously after receiving the reset signal and start to convert parallel data into serial data in synchronization with one another during a pull-in time of the PLL circuit, and
the serialized data is invalid during the pull-in time.

2. The semiconductor device according to claim 1, wherein the serialized data is validated after the pull-in time by inserting a character indicative of the beginning of the data.

3. The semiconductor device according to claim 1, wherein the counter circuit comprises a clock divider and a flip-flop circuit,
the clock divider counts the clock signal to the predetermined number and outputs the reset signal, and
the flip-flop circuit synchronizes the reset signal with the clock signal and distributes the reset signal to the parallel-serial conversion circuits.

* * * * *